United States Patent [19]

Hiraoka

[11] 4,452,665

[45] Jun. 5, 1984

[54] POLYMERIC HALOCARBONS AS PLASMA ETCH BARRIERS

[75] Inventor: Hiroyuki Hiraoka, Saratoga, Calif.

[73] Assignee: International Business Machines Corporation, Armonk, N.Y.

[21] Appl. No.: 541,221

[22] Filed: Oct. 12, 1983

[51] Int. Cl.$^3$ .................. B44C 1/22; C03C 15/00; C03C 25/06; B29C 17/08

[52] U.S. Cl. .................................. 156/643; 156/646; 156/655; 156/659.1; 156/668; 204/192 E; 427/40; 427/43.1; 430/296

[58] Field of Search ............ 156/643, 646, 655, 659.1, 156/668; 430/296; 427/40, 41, 43.1; 204/164, 192 E; 252/79.1

[56] References Cited

U.S. PATENT DOCUMENTS 4,362,598 12/1982 Griffing ............................ 156/643

OTHER PUBLICATIONS

Polymer Engineering and Science, Mid-Nov., 1980, vol. 20, No. 16, Oxygen Plasma Removal of Thin Polymer Films, Taylor et al., pp. 1087-1092.

*Primary Examiner*—William A. Powell
*Attorney, Agent, or Firm*—Joseph G. Walsh

[57] ABSTRACT

A polymeric halocarbon is used as an etch barrier for plasma etching in a process to make high resolution, high aspect ratio polymer patterns.

5 Claims, No Drawings

POLYMERIC HALOCARBONS AS PLASMA ETCH BARRIERS

DESCRIPTION

1. Technical Field

The present invention is concerned with a process for preparing a high resolution, high aspect ratio polymer pattern. In the process a polymeric halocarbon is used as an etch barrier for plasma etching.

2. Background Art

U.S. Pat. No. 4,382,985 shows the use of films of fluoroalkyl acrylate polymer as a resist.

U.S. Pat. No. 4,365,587 shows the formation of organic polymer thin films by means of microwave induced plasmas.

U.S. Pat. No. 4,373,018 shows a multiple exposure microlithography patterning method.

None of the prior art of which we are aware, however, shows or suggests the use of a halocarbon polymer as a barrier for reactive ion etching.

DISCLOSURE OF THE INVENTION

The present invention is a process for preparing a polymer pattern having a high resolution and a high aspect ratio. The process involves the steps of:

(1) depositing a polymer film on a substrate,
(2) covering said polymer film with an etch barrier which is a halocarbon polymer, and
(3) etching by means of reactive ions to yield development in the dry state.

When silanes, siloxanes, or any other organometallic films are used as oxygen etch barriers, metal oxides like $SiO_2$ tend to deposit on the wafers during oxygen plasma or oxygen reactive ion etching. These metal oxides deposits are hard to remove. Aqueous solutions are sometimes used for such removal, but this is not a good solution. The present invention solves this problem by using other etch barriers which do not deposit metal oxides in oxygen plasma, yet serve well as oxygen etch barriers. These etch barriers are halocarbon polymers. They also have the additional advantages that they can be removed completely in dry processing.

Hexafluorobenzene is the most preferred halocarbon to form a polymer film for use in the present invention, but it may be replaced with other halocarbons such as pentafluorostyrene, perfluoro-1,3-butadiene or chlorocarbon compounds. The polymeric halocarbon films have the advantage that they are not readily oxidized, but they can be removed in oxygen plasma/reactive ion etching, or $CF_4$ plasma. Thus, they work as excellent oxygen etch barriers, without depositing the hard-to-remove metal oxides encountered in the prior art.

The polymer film upon the substrate is, for example, PMMA, poly (methylmethacrylate), but any organic polymer film such as a novolac resin, a polystyrene, a polyimide or the like can be used.

This polymer film may be deposited by any of the many methods known to the art, for example by spin-coating, vapor deposition or plasma deposition. The usual substrate is silicon in the form of a wafer, but other materials also may be used.

The dry development which characterizes the present invention is of great advantage in that it avoids the problems associated with solvents and liquid developers. Cracking, adhesion failures and swelling are also avoided. The process has been used to obtain high resolution and high aspect ratio polymer patterns with 0.5 $\mu m$ width and 4 $\mu m$ height, using dry development and no elaborate instruments.

EXAMPLES

Hexafluorobenzene was deposited on PMMA (ca 4 $\mu m$ thick) films in a hydrogen ion beam assisted polymer film deposition reaction, using a "see-through-mask", a mask prepared for electron beam proximity printing technology. The hydrogen pressure was $2 \times 10^{-5}$ torr, and hexafluorobenzene $4 \times 10^{-5}$ torr. The ion gun used was a Commonwealth Sci. Co. Magmiller gun. Its dose level was in the order of $1 \times 10^{-4}$ $C/cm^2$.

After depositing hexafluorobenzene polymer films, the polymer images were developed in oxygen RIE; ca 200 volt self-supporting bias potential, 100 micron oxygen pressure.

Measurements of the oxygen RIE rate of the polymer films deposited from perfluorobenzene (and from pentafluorostyrene vapors) in proton beam induced polymerizations indicate the polymer films were almost like graphite:

The etch rate in $O_2$ RIE: 40~50 A/min.
(−200 volt bias, 0.22 w/cm² total power density)
This value may be compared with graphite etch rate: ~50 A
(−500 volt bias, argon)

The polymer films were deposited on a silicon wafer, and their thickness change was measured with a Talystep.

The same RIE condition provides PMMA etch rate 1500 A/min.

I claim:

1. A process for preparing a high resolution and high aspect ratio polymer pattern, said process being characterized by the steps of:
   (1) depositing a polymer film on a substrate,
   (2) covering said polymer film with an etch barrier which is a halocarbon polymer, and
   (3) etching with reactive ions to yield development in the dry state.

2. A process as claimed in claim 1 wherein the halocarbon polymer is poly(perfluorobenzene).

3. A process as claimed in claim 1 wherein the polymer is poly(perfluoro-1,3-butadiene).

4. A process as claimed in claim 1 wherein the polymer is poly(pentafluorostyrene).

5. A process as claimed in claim 1 wherein the etching is by means of oxygen reactive ion etching.

* * * * *